United States Patent [19]
Keller

[11] Patent Number: 5,581,186
[45] Date of Patent: Dec. 3, 1996

[54] BIRD CAGE RESONATOR FOR HIGH RESOLUTION NUCLEAR MAGNETIC RESONANCE

[75] Inventor: Tony Keller, Rheinstetten, Germany

[73] Assignee: Bruker Analytische Messtechnik GmbH, Silberstreifen, Germany

[21] Appl. No.: 402,539

[22] Filed: Mar. 10, 1995

[30] Foreign Application Priority Data

Mar. 11, 1994 [DE] Germany .................. 44 08 195.2

[51] Int. Cl.[6] .................... G01V 3/00; G01V 3/14
[52] U.S. Cl. .......................... 32.1/318; 324/322
[58] Field of Search ..................... 324/318, 322

[56] References Cited

U.S. PATENT DOCUMENTS

| | | | |
|---|---|---|---|
| 4,751,464 | 6/1988 | Bridges | 324/318 |
| 5,194,811 | 3/1993 | Murphy-Boesch et al. | |
| 5,212,450 | 5/1993 | Murphy-Boesch et al. | 324/322 |
| 5,262,727 | 11/1993 | Behbin et al. | 324/318 |

FOREIGN PATENT DOCUMENTS

| | | | |
|---|---|---|---|
| 0376057 | 7/1990 | European Pat. Off. | G01R 33/34 |
| 1813205 | 6/1970 | Germany | G01N 27/78 |
| 3522401 | 1/1987 | Germany | G01N 24/08 |
| 4013111 | 10/1991 | Germany | G01R 33/34 |
| 4304871 | 8/1993 | Germany | G01R 33/30 |

Primary Examiner—Sandra L. O'Shea
Assistant Examiner—Mark Haynes

[57] ABSTRACT

A resonator which is arranged on a hollow cylindrical support (1) for the taking of high resolution magnetic nuclear resonance spectra from a sample extending along the cylinder axis within the resonator, and having a shielding (2) which defines the sensitive region of the resonator axially along a certain length which is shorter than the axial extent of the support (1), is characterized in that the resonator is configured as an axially symmetric bird-cage resonator. It only produces static field distortions in its sensitive region which are easily correctable, has an improved fill-factor and reduced ohmic losses, and produces a homogeneous RF field while avoiding topological problems occurring with quadrature detection.

21 Claims, 3 Drawing Sheets

BIRD CAGE RESONATOR FOR HIGH RESOLUTION NUCLEAR MAGNETIC RESONANCE

BACKGROUND OF THE INVENTION

The invention concerns a resonator arranged on a hollow cylindrical support for the taking of high resolution nuclear magnetic resonance spectra from a sample which extends along the axis of the cylinder within the resonator, having a shielding which defines the region of sensitivity of the resonator along an axial length which is shorter than the axial extent of the support.

A resonator of this type is known in the art as an NMR probe from DE 43 04 871 A1.

In a high resolution nuclear resonance spectrometer, the radio frequency resonator or the radio frequency coil for excitation and detection of nuclear resonance signals from a sample is generally located in a so-called probe head within the axial room temperature bore of a superconducting magnet at the extremely homogeneous center of the static magnetic field produced thereby. In general, the sample to be measured is a liquid within a hollow cylindrical sample tube whose central region is surrounded by the radio frequency coil, which is normally a saddle coil.

It is desirable to limit the region of sensitivity of the radio frequency coil to an axially well-defined length. In order to maintain the full resolution capability the static magnetic field must be as homogeneous as possible along the entire sensitive region. The field homogeneity in high resolution nuclear resonance spectroscopy is $10^{-9}$ and better. In addition to the fundamental inhomogeneity of the magnet, additional field distortions occur due, in particular, to the susceptibilities of the finite length sample and the high frequency coil as well as other weak magnetic components of the probe head. The excitation or detection of nuclear resonance signals from sample regions in which the static magnetic field significantly deviates from its central value should therefore be avoided. Such regions are the end regions of the RF coil as well as regions in which the leads are in proximity to the sample. With the considerably openly structured RF saddle coil, the RF field extends far beyond the central sample region and the RF field lines can close at rather distant sample regions. The above mentioned publication, DE 43 04 871 A1, therefore describes both a hollow cylindrically-shaped shield for the coil end regions and the leads as well as a shield for the RF stray fields effected by two conducting sheets axially above and below the RF saddle coil.

The utilization of a saddle coil with, perhaps, an associated shielding as a radio frequency coil in a high resolution NMR spectrometer has a number of fundamental disadvantages. Due to its open structure it has a poor fill-factor, e.g. only a fraction of the RF magnetic field produced is utilized to excite the sample or only a fraction of the sample signal is detected. For the same reason an RF stray field occurs outside of the actual sample region of interest which excites signals in undesirable sample regions. This stray field can only be shielded with difficulty and not always with a satisfactory degree of success.

A pair of RF saddle coils is a rather asymmetric object which, with non-vanishing magnetic susceptibility of the coil material, produces distortions of the static magnetic field which are difficult to correct. Since one attempts to achieve an increased fill-factor to increase the signal-to-noise-ratio, the coil surrounds the sample in as close a manner as possible and these distortions effect the sample in the sensitive region. A magnetic compensation of the coil wire can provide assistance. However, such compensated wires are extremely difficult to produce. In addition, a residual reduced susceptibility generally remains.

An RF saddle coil pair is only one component of the radio frequency resonant circuit which also includes at least one capacitor. Although same is located within the probe head it is nevertheless spatially separated from the RF coil and connected to same by means of conductors having lengths of several centimeters. This increases the ohmic portion in the resonance circuit and leads to additional undesirable stray inductance.

The RF magnetic field produced by a pair of saddle coils is only moderately homogeneous along the sample.

In order to detect a signal in quadrature it is necessary to utilize two saddle coil pairs which are rotated about the resonator axis by 90° with respect to each other, leading to additional topological problems.

It is therefore the purpose of the present invention to introduce a resonator of the above-mentioned kind for the excitation and detection of nuclear spin resonance signals which produces only easily correctable static field distortions in its region of sensitivety, which has an improved fill-factor and reduced ohmic losses, produces a largely homogeneous RF field, and avoids topological problems with quadrature detection.

SUMMARY OF THE INVENTION

This purpose is completely achieved in a surprisingly simple fashion in that the resonator is configured as an axially symmetric bird-cage resonator.

Utilization of a bird-cage resonator instead of saddle coils is per se known in the art from NMR tomography imaging, for example, from DE 35 22 401 A1. The homogeneity of the magnetic field in the measuring volume of an imaging tomography apparatus is in the range of $10^{-4}$ to $10^{-5}$ and is therefore removed by several orders of magnitude from the required field homogeneities of $10^{-9}$ and below of high resolution spectroscopy. Furthermore, the outer dimensions of a tomography apparatus within which, for medical applications, a complete person must normally be accommodated in the measuring volume, are substantially larger than the dimensions of a high resolution NMR spectrometer where only a sample tube containing the substance to be measured must be introduced into the measuring volume. When utilizing a bird-cage resonator in high resolution NMR spectroscopy problems are therefore caused by the production of structure on the support which, in tomography imaging as mentioned-above is relatively large but in spectroscopy is relatively small especially since the dielectric support material must be extremely homogeneous in the high resolution region. An additional problem is the spatial integration of the capacitors necessary in the resonator resonance circuit into the resonator structure, whereby capacitors normally cause non-compensatable magnetic field distortions.

The axially symmetric bird-cage resonator has the advantages of a large fill-factor, high symmetry and the thereby resulting minimal interference with the magnetic field in the measuring volume, high radio frequency homogeneity, as well as relatively low ohmic losses leading to a high Q and to improved resonator efficiency. In addition, with a bird-cage resonator in contrast to saddle coils, 90° displaced quadrature detection of the RF signal relative to the RF excitation can be easily carried out.

In a preferred embodiment of the resonator in accordance with the invention, the cage forming the resonator is introduced on the hollow cylindrical support and includes largely equally distributed, equal length and axis-parallel metallic rods around the circumference which are each connected, at least at one end, to an end ring via capacitors.

In an improvement of this embodiment the rods are connected at both ends to end rings via capacitors.

Another embodiment provides for introducing the cage forming the resonator onto the hollow cylindrical support including largely equally distributed, equally long and axis-parallel metallic rods around the circumference which are each connected, at least at one end, to their neighboring rods via capacitors.

In an improvement of this embodiment the rods can be connected at both ends via capacitors.

In a particularly preferred embodiment the rods and the capacitors are introduced onto the outer wall of the hollow cylindrical support and the shielding extends axially, at least in each axial region of the capacitor, on the inner wall of a support. In this fashion the RF resonator in the vicinity of the capacitor is RF-shielded with respect to the measuring volume so that disturbances caused by the capacitors as well as by the end regions of the cage rods are minimized.

In an improvement of this embodiment the structures belonging to the resonator such as rods and/or shields and/or end rings are completely or partially constructed from layers deposited on or applied to the support.

The capacitors can also be constructed from layers deposited onto the support tube, whereby depending on the material utilized (glass, quartz, ceramic and the like) the thin support tube can serve as a dielectric.

It is preferred when the rods and/or the shielding as well as possibly the end rings are largely constructed from a metal with high conductivity.

An embodiment is particularly preferred with which the rods and/or the shields and/or possibly the end rings comprise an least two components whose magnetic susceptibilities compensate each other so that the field homogeneity in the measuring volume cannot be negatively influenced. One speaks of "susceptibility compensation". This, however, does not mean that two materials with precisely opposite susceptibilities must be utilized in each case. The actual quantity compensated is the product of the volume with the susceptibility in each case.

For example, in embodiments, one component can comprise a diamagnetic metal and the other component a paramagnetic metal. The fine structure of the conducting cage structures is thereby relatively unimportant, however, the axial length must be equal in each case in order to prevent a resulting net susceptibility due to geometric asymmetries in the measuring volume. The utilization of a hard component has the additional advantage that a particularly hard and scratch-resistant surface is created for the resonator structure.

In a further preferred embodiment of the resonator in accordance with the invention the rods and/or the shielding as well as possibly the end rings comprise at least two components one of which has a high and the other a relatively low radio frequency (RF) conductivity.

In this fashion one can guarantee that the RF current flows almost exclusively in the RF conducting components of the structure.

An improvement of this embodiment is advantageous with which the components having high RF conductivity comprise a layer thickness which is several, preferentially at least 3, times that of the RF skin depth.

Since the RF skin depth, at normal frequencies, is approximately 5–10 μm, the layer thicknesses should be in the vicinity of 15–100 μm.

In order to achieve the desired susceptibility compensation the two components with high and low RF conductivity can be, in the radial direction of the resonator, spatially above another displaced adjacent to each other in the circumferential direction.

The capacitors of the resonator in accordance with the invention should comprise as low a magnetic susceptibility as possible in order to keep appropriate field disturbances in the measuring volume a priori as small as possible.

The capacitors are preferentially susceptibility compensated with respect to the measuring volume within the resonator through selection of appropriate materials or through additives. A susceptibility compensation of the capacitor with respect to the measuring volume in the resonator can also be additionally effected through the utilization of an appropriate soldering material for connecting the capacitors in an electrically conducting fashion to the resonator structure.

In order to avoid a drift of the measuring signal, the capacitors utilized for the resonator in accordance with the invention should be temperature-insensitive.

SMD (surface mounted device) components are particularly preferred for the capacitors. These can be built into the layer structure of the bird-cage resonator in a particularly simple fashion or be connected to same.

In a further embodiment, instead of capacitors, conductive layers can be provided on the inner side of the support which, in the circumferential direction of the resonator, bridge the gaps between the rods and their ends. Since the support is normally comprised from a dielectric material, usually from glass or quartz, capacitance results due to the rod structure and overlapping surfaces of the bridging layers at the ends of the rods.

Alternatively the capacitors can be eliminated by providing, in another embodiment, for a dielectric insulating layer enveloping the rods and bridging the gaps between the rods and their ends in the circumferential direction of the resonator as well an electrically conducting layer surrounding the insulating layer in a ring-shaped fashion. In this manner capacitances between the rods and the ring-shaped conducting layer can be produced.

In an improvement of both mentioned embodiments no shielding is provided for in the axial region of the bridging layers since the rods and the bridging layers can be fashioned through the choice of material and geometry in such a manner that the influence of their total susceptibilities in the measuring volume of the resonator is largely compensated for.

The resonance frequency of the resonator in accordance with the invention typically lies above 400 MHz. Its typical diameter is less than 20 mm, and the number of rods typically assumes a value between 4 and 16. In this fashion, the resonator in accordance with the invention distinguishes itself in its dimensions as well as in its operation region in a substantial fashion from the bird-cage resonators known in the art of NMR tomography imaging.

In order to improve the signal-to-noise-ratio of the resonator in accordance with the invention, a quadrature detection device, displaced by 90° to the RF excitation, can be provided for. Quadrature detection is particularly advantageous in the rotationally symmetric samples normally used in high resolution NMR spectroscopy.

Alternatively, in an embodiment of the resonator in accordance with the invention, the cage rods are distributed at equal distances about the circumference of the resonator structure, whereby two oppositely lying rods are left out. In this fashion a stabilization of the linear oscillation mode is achieved and mode instabilities are avoided. In order to avoid asymmetries it is possible for both rods to remain. One must, however, assure that no or only very little RF current can flow through same, for example, by introducing an interruption or by the choice of "false" capacitance values.

In particular embodiments the cage can be configured in such a fashion that two orthogonal RF fields of differing frequencies can be produced and detected within its interior. In this fashion two differing nuclear types and their spin couplings (for example protons and $C^{13}$) can be simultaneously investigated with the same measuring apparatus.

In a simple embodiment of the resonator in accordance with the invention the support material for the cage structure is glass.

An embodiment is also advantageous with which the resonator in accordance with the invention additionally has a coaxial, metallic outer shielding cylinder of larger diameter than the support cylinder with which the resonator is rendered insensitive with respect to the external environment so that defined conditions with respect to the field distribution always reign within the measuring volume.

In an improvement of this embodiment the end ring of the resonator can be conductively connected to the outer shielding cylinder. This increases the shielding effect and the insensitivity of the resonator with respect to external influences.

Further advantages of the invention can be derived from the description and the accompanying drawings. The above-mentioned features and those which are to be further described below in accordance with the invention can be utilized individually or collectively in arbitrary combination. The embodiments mentioned are not to be considered as exhaustive enumeration rather have exemplary character only.

The invention is represented in the drawing and will be further described and explained with reference to concrete embodiments.

BRIEF DESCRIPTION OF THE DRAWING

FIG. 1b shows a schematic cross section along the line A–B of FIG. 1a;

DESCRIPTION OF THE PREFERRED EMBODIMENT

Figure 1A:
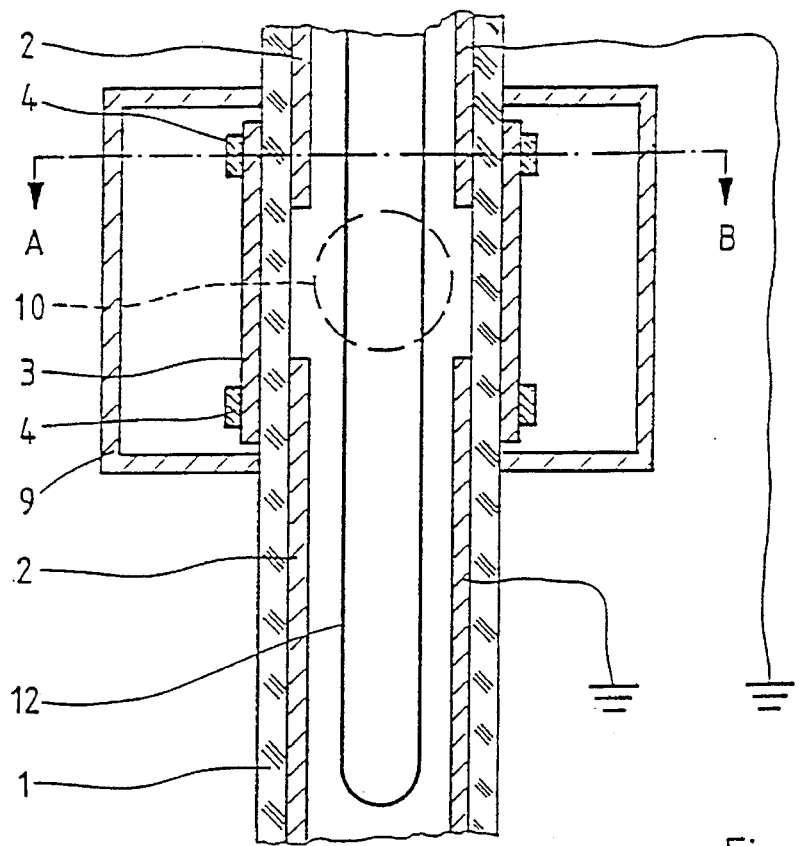
FIG. 1a shows a schematic longitudinal section through a resonator in accordance with the invention.

The RF resonator in accordance with the invention shown in FIG. 1a for the recording of high resolution magnetic nuclear resonance (NMR) spectra from a sample, which is usually a liquid sample located in a sample tube 12 extending along the cylinder axis within the resonator, comprises a hollow cylindrical support 1 having largely equally distributed, equally long and axis-parallel electrically conducting metallic rods 3 brought onto or deposited about its circumference around a measuring volume 10. The rods are either connected to an upper end ring 4 and/or are each connected to each other via lower capacitors 5. They can, however, in an embodiment not shown, be directly connected at one or both ends to the inner neighboring rods 3 via capacitors 5. The rods 3 thereby form the inductances and the capacitors the capacitances of an RF resonator circuit.

In order to limit the sensitive region of the axially symmetric bird-cage resonator configured in this fashion to a certain length which is shorter than the axial extent of the support 1, shielding 2 is provided for within the resonator which is brought onto the inner wall of the support tube 1 in the example shown.

Figure 1B:
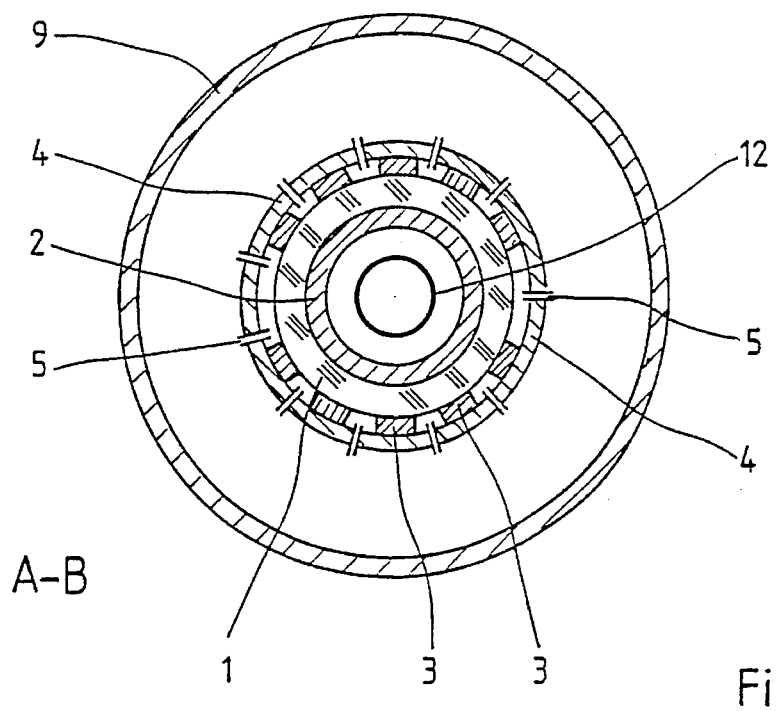

In the example shown in FIG. 1a and 1b, a coaxial metallic outer shielding cylinder 9 is additionally provided for which has a diameter larger than the support cylinder 1 and which shields the measuring volume 10 from external influences.

The resonator structures such as rods 3, shielding 2, end rings 4 and outer shielding 9, can, for example, be largely comprised from silver in order to guarantee as large a conductivity as possible. They can, however, also be made from two components whose magnetic susceptibility compensate each other so that no magnetic field disturbances occur in the measuring volume 10 due to the resonator structures. One component can thereby comprise a diamagnetic metal and the other a paramagnetic metal. Furthermore, the structures of the bird-cage resonator can be constructed from components, one of which has a high and the other a low high frequency conductivity so that the highly conducting component completely carries the RF current. In particular, the highly conducting component should comprise a layer thickness which is several times, preferentially at least 3 times, the thickness of the RF skin depth at the high frequency utilized. For compensation, both components can be spatially arranged above each other in the radial direction of the resonator or be adjacent to another and circumferentially displaced.

In the embodiment shown in FIG. 1 two oppositely lying rods are left out of the bird-cage structure so that unique RF oscillation modes can establish themselves and mode instabilities are avoided.

Figure 3:
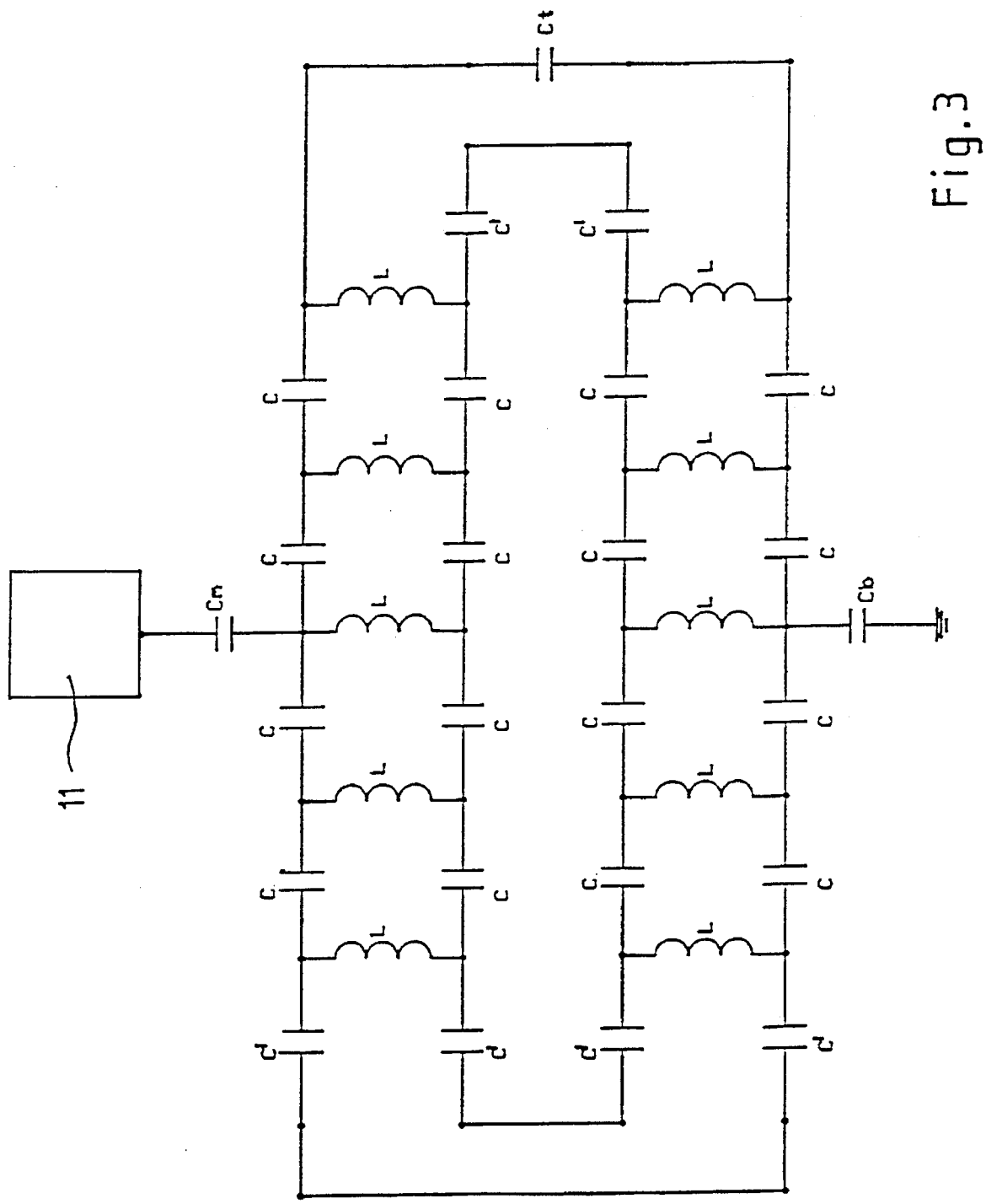
FIG. 3 shows an equivalent electrical circuit diagram for an embodiment of the resonator in accordance with the invention.

An equivalent circuit diagram is shown in FIG. 3 for the embodiment of the bird-cage resonator in accordance with FIG. 1b, whereby the rods 3 are represented by inductances L and the capacitors by capacitances C, C'. A compensating capacitor Cb leads to ground, and a tuning of the resonant circuit can be effected with a tuning capacitor Ct. The measuring signal is taken off the resonator and passed to a detection device 11 via matching capacitor Cm.

Typical capacitances for the capacitors in the example shown are C=10 pF, C'=7 pF, Cb=5 pF, Ct=1–5 pF (variable) and Cm=1–7 pF (variable).

The apparatus 11 shown can, in embodiments of the bird-cage resonator in accordance with the invention, with which the two oppositely lying rods 3 are not removed, be configured as a quadrature detector.

The resonance frequency of the bird-cage resonator is normally above 400 MHz. The diameter of the cage is typically smaller than 20 mm, whereby the number of rods 3 is between 4 and 16. Glass can, for example, be utilized as the material for the support 1.

Figure 2A:
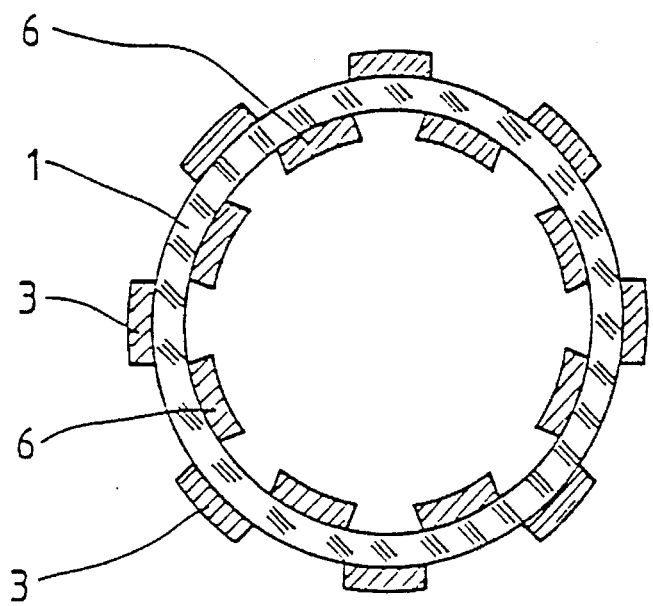
FIG. 2a shows a schematic cross section through an embodiment of the resonator in accordance with the invention.

FIG. 2a shows a special embodiment with which conducting layers 6 are provided on the inner side of the dielectric support 1 around the circumference of the resonator which bridge the gaps between the rods 3 and their corresponding ends. Capacitances thereby occur in the dielectric of the support 1 for the resonance circuit of the resonator in the overlap region between the rods 3 and layers 6.

Figure 2B:
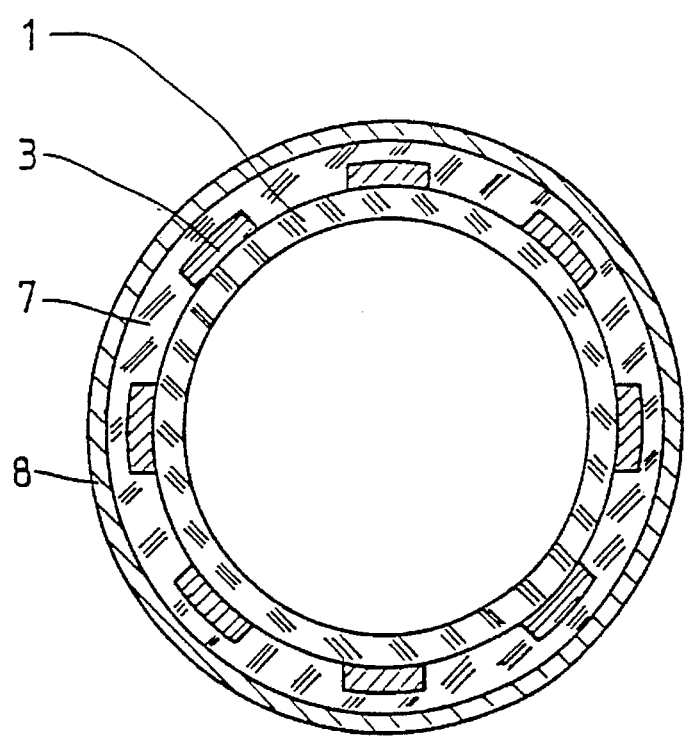
FIG. 2b shows a schematic cross section through another embodiment of the resonator in accordance with the invention.

In a further embodiment shown in FIG. 2b, a dielectric insulating layer 7 jacketing the rods 3 and bridging, in the circumferential direction of the resonator, the gaps between the rods 3 and their ends as well as an electrically conducting layer 8 surrounding the insulating layer 7 in a ring-shaped fashion are provided for instead of capacitors.

In this fashion capacitances are also built-up in the dielectric 7 between the conducting rods 3 and the conducting ring layer 8 which replace the capacitors.

In the embodiments shown in FIG. 2a and 2b, a shielding 2 can be left-out in the axial region of the layers 6 or 7 and 8 bridging the gaps between the rods 3.

We claim:

1. A resonator assembly for high resolution nuclear magnetic resonance of a sample positioned along an axis of the assembly, the resonator assembly comprising:

a hollow cylindrical support;

an axially symmetric bird-cage resonator mounted on the support, the bird-cage resonator comprising largely equally distributed, equally long and axis-parallel metallic rods arranged about a circumference of the support and having first and second rod ends;

first capacitor means connected between neighboring rods at the first rod end; and radio frequency shielding means located between the bird-cage resonator and the sample at an axial region of the first capacitor means.

2. The resonator assembly of claim 1, wherein the bird-cage resonator is formed on the hollow cylindrical support and comprises largely equally distributed, equally long and axis-parallel metallic rods arranged about a circumference of the support and having first and second rod ends, the resonator assembly further comprising a first end ring and first capacitor means connected between the first rod ends and the first end ring.

3. The resonator assembly of claim 2, further comprising a second end ring and second capacitor means, the second capacitor means being connected between the second rod ends and the second end ring.

4. The resonator assembly of claim 3, further comprising second capacitor means connected between neighboring rods at the second rod end.

5. The resonator assembly of claim 2, wherein the rods and the first capacitor means are supported on an outer wall of the hollow cylindrical support, and the shielding means extend axially on an inner wall of the support.

6. The resonator assembly of claim 5, wherein at least one of the rods, the shielding means, and the first end ring comprise deposited layers.

7. The resonator assembly of claim 2, wherein at least one of the rods, the shielding means, and the first end ring comprise silver.

8. The resonator assembly of claim 2, wherein at least one of the rods, the shielding means, and the first end ring comprise a first and a second component having mutually compensating magnetic susceptibilities.

9. The resonator assembly of claim 8, wherein the first component comprises a diamagnetic metal and the second component a paramagnetic metal.

10. The resonator assembly of claim 2, wherein at least one of the rods, the shielding means, and the first end ring comprise a first component having a high and a second component having a low radio frequency (RF) conductivity.

11. The resonator assembly of claim 10, wherein the first component has a layer thickness which is several times an RF skin depth.

12. The resonator assembly of claim 10, wherein the first component is in proximity to the second component and is one of radially and circumferentially displaced from the second component.

13. The resonator assembly of claim 2, wherein the first capacitor means comprise SMD (surface mounted device) components.

14. The resonator assembly of claim 2, wherein the first capacitor means comprise conducting layers arranged in a circumferential direction on a side of the support facing away from the rods, the conducting layers bridging gaps between the rods at the first rod ends.

15. The resonator assembly of claim 2, wherein the first capacitor means comprise an insulating layer jacketing the rods, bridging gaps between the rods at the first rod end, and arranged around a circumferential direction of the resonator and a conducting layer surrounds the insulating layer in a ring-shaped fashion.

16. The resonator assembly of claim 2, further comprising a coaxial metallic outer shielding cylinder having a larger diameter than the support.

17. The resonator assembly of claim 16, wherein the first end ring is connected in a conducting fashion to the outer shielding cylinder.

18. The resonator assembly of claim 1, wherein the bird-cage resonator is adapted to at least one of simultaneously produce and detect two orthogonal RF fields of differing frequency within its interior.

19. The resonator assembly of claim 1, further comprising means for quadrature detection of measuring signals recorded with the resonator.

20. A resonator assembly for high resolution nuclear magnetic resonance of a sample positioned along an axis of the assembly, the resonator assembly comprising:

a hollow cylindrical support;

an axially symmetric bird-cage resonator mounted on the support, the bird-cage resonator being formed on the hollow cylindrical support and comprising largely equally distributed, equally long and axis-parallel metallic rods arranged about a circumference of the support and having first and second rod ends;

a first end ring;

a first capacitor means connected between the first rod ends and the first end ring, the first capacitor means being supported on an outer wall of the hollow cylindrical support; and radio frequency shielding means located between the bird-cage resonator and the sample for defining a region of sensitivity of the resonator along a length which is shorter than an axial length of the support, the shielding means extending axially on an inner wall of the support at an axial region of the first capacitor means.

21. A resonator assembly for high resolution nuclear magnetic resonance of a sample positioned along an axis of the assembly, the resonator assembly comprising:

a hollow cylindrical support;

an axially symmetric bird-cage resonator mounted on the support, the bird-cage resonator being formed on the hollow cylindrical support and comprising largely equally distributed, equally long and axis-parallel metallic rods arranged about a circumference of the support and having first and second rod ends;

a first end ring;

a first capacitor means connected between the first rod ends and the first end ring;

a second end ring;

a second capacitor means connected between the second rod ends and the second end ring; and radio frequency shielding means located between the bird-cage resonator and the sample for defining a region of sensitivity of the resonator along a length which is shorter than an axial length of the support, the shielding means extending axially on an inner wall of the support at an axial region of the first capacitor means and at an axial region of the second capacitor means.

* * * * *